United States Patent
Dent et al.

(10) Patent No.: US 6,940,177 B2
(45) Date of Patent: Sep. 6, 2005

(54) SEMICONDUCTOR PACKAGE AND METHOD OF PREPARING SAME

(75) Inventors: Stanton James Dent, Midland, MI (US); Lyndon James Larson, Auburn, MI (US); Robert Thomas Nelson, Bay City, MI (US); Debra Charilla Rash, Santa Cruz (BO)

(73) Assignee: Dow Corning Corporation, Midland, MI (US)

( * ) Notice: Subject to any disclaimer, the term of this patent is extended or adjusted under 35 U.S.C. 154(b) by 0 days.

(21) Appl. No.: 10/068,755

(22) Filed: May 16, 2002

(65) Prior Publication Data

US 2003/0214051 A1 Nov. 20, 2003

(51) Int. Cl.[7] ............................................. H01L 23/48
(52) U.S. Cl. ..................... 257/779; 257/678; 257/784; 257/668; 257/778; 257/788; 257/789; 257/791; 257/782; 257/783; 257/795; 257/84; 438/106; 438/108; 438/121; 438/127; 156/335
(58) Field of Search ................................ 257/668, 778, 257/784, 788, 789, 791, 795, 782, 783, 779, 678, 84; 438/106, 108, 127, 121; 538/15, 25; 156/335

(56) References Cited

U.S. PATENT DOCUMENTS

| | | | |
|---|---|---|---|
| 5,171,716 A | 12/1992 | Cagan et al. | 437/211 |
| 6,103,552 A | 8/2000 | Lin | 438/113 |
| 6,197,613 B1 | 3/2001 | Kung et al. | 438/106 |
| 6,239,378 B1 * | 5/2001 | Shephard | 174/110 S |
| 6,277,669 B1 | 8/2001 | Kung et al. | 438/106 |
| 6,284,563 B1 * | 9/2001 | Fjelstad | 438/106 |
| 2004/0102601 A1 * | 5/2004 | Saito et al. | 528/271 |

FOREIGN PATENT DOCUMENTS

EP  1041117 A2 * 4/2000

* cited by examiner

Primary Examiner—Eddie Lee
Assistant Examiner—Junghwa Im
(74) Attorney, Agent, or Firm—Catherine U. Brown (57) ABSTRACT

A semiconductor package comprising a semiconductor wafer having an active surface comprising at least one integrated circuit, wherein each integrated circuit has a plurality of bond pads; and at least one cured silicone member covering at least a portion of the active surface, wherein at least a portion of each bond pad is not covered by the silicone member, the silicone member has a coefficient of linear thermal expansion of from 60 to 280 $\mu$m/m° C. between -40 and 150° C. and a modulus of from 1 to 300 MPa at 25° C., and the silicone member is prepared by the method of the invention.

29 Claims, 3 Drawing Sheets

SEMICONDUCTOR PACKAGE AND METHOD OF PREPARING SAME

FIELD OF THE INVENTION

The present invention relates to a semiconductor package and more particularly to a wafer-level semiconductor package containing a cured silicone member. The present invention also relates to a method of preparing the semiconductor package.

BACKGROUND OF THE INVENTION

Integrated circuit (IC) chips or dice are commonly packaged before assembly on a printed wiring board (PWB). The package has several important functions, including interconnection (power and signal transmission), mechanical and environmental protection, and heat dissipation. In addition, the package acts as a mechanism for "spreading apart" the connections from the tight pitch (center to center spacing between bond pads) on the IC chip to the relatively wide pitch required by the printed circuit board manufacturer.

In the highly competitive market of electronic packaging, factors of performance, throughput, cost, and reliability have a major influence on packaging technologies. Although packaging is usually performed on individual IC chips, there is growing interest in developing methods of packaging ICs at the wafer level, (i.e., before singulation of individual chips from the wafer). Wafer-level packaging can potentially achieve higher throughput, higher reliability, and lower costs than individual chip packaging.

The reliability of IC packages is often limited by failure of the interconnect elements (e.g., solder joints, bond wires) between the die and the package substrate or between the package and the PWB. Such failures are often due to mechanical stresses incurred during package assembly and/or differences in coefficients of thermal expansion (CTE) between the silicon die and substrate materials. Consequently, various approaches to minimizing mechanically or thermally induced stresses in semiconductor packages have been reported. For example, U.S. Pat. No. 5,171,716 to Cagan et al. discloses a semiconductor device containing a stress-relief layer having a glass transition temperature below 150° C.

Kang et al. teach a wafer-level chip scale package containing a high CTE/modulus dielectric polymer as a stress buffer layer (Electronic Components and Technology Conference Proceedings, 2000, 87–92).

Strandjord et al. teach a one mask process for stress-buffer and passivation applications using photosensitive benzocyclobutene (IEMT/IMC Symposium Proceedings, 1997, 261–266).

U.S. Pat. No. 6,103,552 to Lin discloses a process and a package for wafer-scale packaging. The process includes depositing a layer of a polymeric material, such as polyimide, silicone elastomer, or benzocyclobutene on the surface of a chip. The '552 patent further teaches that the temperature coefficient of expansion of the polymer should be low so as to match that of the metal studs in the package, thereby minimizing local stresses at the stud-polymer interface.

U.S. Pat. No. 6,197,613 to Kung et al. discloses a method of forming a wafer-level package wherein an insulative elastic material layer is provided as a base layer for a multiplicity of metal traces wherein the elastic material has a sufficiently low Young's modulus for functioning as a stress-buffing layer.

U.S. Pat. No. 6,277,669 to Kung et al. discloses a method for fabricating a wafer-level package wherein an elastomeric material layer is first deposited on top of a passivation layer by a printing, coating or laminating method to form a plurality of isolated islands.

Although the aforementioned approaches to semiconductor packaging provide packages having a range of thermal properties, there is a continued need for a semiconductor package having superior thermal stability and reliability.

SUMMARY OF THE INVENTION

The present invention is directed to a semiconductor package comprising:
  a semiconductor wafer having an active surface comprising at least one integrated circuit, wherein each integrated circuit has a plurality of bond pads; and
  at least one cured silicone member covering at least a portion of the active surface, wherein at least a portion of each bond pad is not covered by the silicone member, the silicone member has a coefficient of linear thermal expansion of from 60 to 280 $\mu$m/m° C. between −40 and 150° C. and a modulus of from 1 to 300 MPa at 25° C., and the silicone member is prepared by a method comprising the steps of:
    (i) printing a silicone composition on the active surface to form a silicone deposit, wherein the silicone composition comprises:
      (A) an organopolysiloxane containing an average of at least two silicon-bonded alkenyl groups per molecule,
      (B) an organohydrogensiloxane containing an average of at least two silicon-bonded hydrogen atoms per molecule in a concentration sufficient to cure the composition,
      (C) an effective amount of an inorganic filler having a surface area less than 25 m$^2$/g, and
      (D) a catalytic amount of a hydrosilylation catalyst; and
    (ii) heating the silicone deposit for an amount of time sufficient to form the cured silicone member.

The present invention is further directed to a method of preparing a semiconductor package, the method comprising the steps of:
  (i) printing a silicone composition on at least a portion of an active surface of a semiconductor wafer to form at least one silicone deposit, wherein the active surface comprises at least one integrated circuit, each integrated circuit has a plurality of bond pads, at least a portion of each bond pad is not covered by the silicone deposit, and the silicone composition comprises:
    (A) an organopolysiloxane containing an average of at least two silicon-bonded alkenyl groups per molecule,
    (B) an organosilicon compound containing an average of at least two silicon-bonded hydrogen atoms per molecule in a concentration sufficient to cure the composition,
    (C) an effective amount of an inorganic filler having a surface area less than 25 m$^2$/g, and
    (D) a catalytic amount of a hydrosilylation catalyst; and
  (ii) heating the silicone deposit for an amount of time sufficient to form a cured silicone member, wherein the member has a coefficient of linear thermal expansion of from 60 to 280 $\mu$m/m° C. between −40 and 150° C. and a modulus of from 1 to 300 MPa at 25° C.

The semiconductor package of the present invention exhibits good thermal stability over a wide range of temperatures and good environmental resistance. Also, the semiconductor package permits simultaneous testing of all ICs on a wafer. Moreover, individual chips can be singulated (separated) from the wafer-level semiconductor package, with each chip having a size only slightly larger than the IC itself. These "chip scale packages", which are lighter, smaller, and thinner than conventional IC packages, are ideally suited for high-density applications.

The method of preparing the semiconductor package of the present invention is scaleable to a high throughput manufacturing process. Importantly, the method provides simultaneous packaging of all ICs on a wafer. Additionally, the method employs conventional stencil printing equipment and methods. Compared with packaging methods employing classical spin-coating techniques, the present method has less waste (silicone composition) and fewer process steps.

The semiconductor package of the present invention can be used to prepare individual IC chip packages. The chip packages are useful for fabricating printed wiring boards, which can be incorporated into electronic equipment, such as calculators, telephones, televisions, and mainframe and personal computers.

These and other features, aspects, and advantages of the present invention will become better understood with reference to the following description, appended claims, and accompanying drawings.

DETAILED DESCRIPTION OF THE INVENTION

A semiconductor package according to the present invention comprises:

a semiconductor wafer having an active surface comprising at least one integrated circuit, wherein each integrated circuit has a plurality of bond pads; and at least one cured silicone member covering at least a portion of the active surface, wherein at least a portion of each bond pad is not covered by the silicone member, the silicone member has a coefficient of linear thermal expansion of from 60 to 280 $\mu$m/m° C. between −40 and 150° C. and a modulus of from 1 to 300 MPa at 25° C., and the silicone member is prepared by a method comprising the steps of:

(i) printing a silicone composition on the active surface to form a silicone deposit, wherein the silicone composition comprises:

(A) an organopolysiloxane containing an average of at least two silicon-bonded alkenyl groups per molecule, (B) an organohydrogensiloxane containing an average of at least two silicon-bonded hydrogen atoms per molecule in a concentration sufficient to cure the composition, (C) an effective amount of an inorganic filler having a surface area less than 25 m$^2$/g, and (D) a catalytic amount of a hydrosilylation catalyst; and (ii) heating the silicone deposit for an amount of time sufficient to form the cured silicone member.

The semiconductor wafer comprises a semiconductor material such as silicon and gallium arsenide. The active surface of the semiconductor wafer comprises at least one, typically more than 100 ICs. Examples of ICs include, but are not limited to, DRAM, FLASH, SRAM, and LOGIC devices. Each IC has a plurality of bond pads (i.e., I/O terminals), usually located on the periphery of the IC. The number of bond pads per integrated circuit can range from about 4 to about 2,000, depending on the complexity of the circuit. The bond pads are made of an electrically conductive metal, typically aluminum, copper, or alloys thereof.

The semiconductor wafer can further comprise a passivation layer covering the active surface of the wafer except the bond pads. Examples of materials suitable for passivation layers include polyimide, benzocylobutene, and polybenzoxazole. Also, the semiconductor wafer can contain streets or scribe lines, along which the wafer can be sawed into individual chips. Methods of fabricating integrated circuits on semiconductor wafers are well known in the art.

The cured silicone member can have a variety of forms, including, but not limited to, dome, layer, cylinder, sphere, hemisphere, cone, cube, ellipse, hexagon, oval, pyramid, wedge, polyhedron, and disc. The particular form depends on the rheological properties of the uncured silicone composition, size and shape of apertures in the stencil or screen, and print conditions. The thickness (or height) of the silicone member can be from 10 to 250 $\mu$m, alternatively from 10 to 200 $\mu$m, or alternatively from 10 to 50 $\mu$m.

The cured silicone member has a coefficient of linear thermal expansion of from 60 to 280 $\mu$m/m° C., alternatively from 60 to 180 $\mu$m/m° C., or alternatively from 150 to 180 $\mu$m/m° C., between −40 and 150° C. Additionally, the cured silicone member has a modulus of from 1 to 300 MPa, alternatively from 1 to 100 MPa, or alternatively from 1 to 20 MPa, at 25° C. The coefficient of thermal expansion and modulus of the cured silicone member are determined as described in Examples below.

The cured silicone member is prepared using a silicone composition comprising (A) an organopolysiloxane containing an average of at least two silicon-bonded alkenyl groups per molecule, (B) an organohydrogensiloxane containing an average of at least two silicon-bonded hydrogen atoms per molecule in a concentration sufficient to cure the composition, (C) an effective amount of an inorganic filler, and (D) a catalytic amount of a hydrosilylation catalyst.

Component (A) is at least one organopolysiloxane containing an average of at least two silicon-bonded alkenyl groups per molecule. The organopolysiloxane can have a linear or branched structure. The organopolysiloxane can be a homopolymer or a copolymer. The alkenyl groups can have from 2 to 10 carbon atoms and are exemplified by, but not limited to, vinyl, allyl, butenyl, and hexenyl. The alkenyl groups in the organopolysiloxane can be located at terminal, pendant, or both terminal and pendant positions. The remaining silicon-bonded organic groups in the organopolysiloxane are independently selected from monovalent hydrocarbon and monovalent halogenated hydrocarbon groups free of aliphatic unsaturation. These monovalent groups can have from 1 to 20 carbon atoms or alternatively from 1 to 10 carbon atoms, and are exemplified by, but not limited to alkyl such as methyl, ethyl, propyl, pentyl, octyl, undecyl, and octadecyl; cycloalkyl such as cylcohexyl; aryl such as phenyl, tolyl, xylyl, benzyl, and 2-phenylethyl; and halogenated hydrocarbon groups such as 3,3,3-trifluoropropyl, 3-chloropropyl, and dichlorophenyl.

The viscosity of the organopolysiloxane at 25° C., which varies with molecular weight and structure can be from 0.002 to 60 Pa·s, alternatively from 0.002 to 50 Pa·s, or alternatively from 0.1 to 10 Pa·s.

Examples of organopolysiloxanes useful in the silicone composition include, but are not limited to, polydiorganosiloxanes having the following formulae:

where Me, Vi, and Ph denote methyl, vinyl, and phenyl respectively and a has a value such that the viscosity of the polydiorganosiloxane is from 0.002 to 60 Pa·s at 25° C.

Methods of preparing organopolysiloxanes suitable for use in the silicone composition, such as hydrolysis and condensation of organohalosilanes or equilibration of cyclic polydiorganosiloxanes, are well known in the art.

Component (A) can be a single organopolysiloxane or a mixture comprising two or more organopolysiloxanes that differ in at least one property, such as structure, viscosity, average molecular weight, siloxane units, and sequence.

Component (B) is at least one organohydrogensiloxane containing an average of at least two silicon-bonded hydrogen atoms per molecule. It is generally understood that crosslinking occurs when the sum of the average number of alkenyl groups per molecule in component (A) and the average number of silicon-bonded hydrogen atoms per molecule in component (B) is greater than four. The silicon-bonded hydrogen atoms in the organohydrogensiloxane can be located at terminal, pendant, or both terminal and pendant positions.

The organohydrogensiloxane can be a disiloxane, trisiloxane, or polysiloxane. The structure of the organohydrogensiloxane can be linear, branched, cyclic, or resinous.

Examples of organohydrogensiloxanes include, but are not limited to, disiloxanes such as 1,1,3,3-tetramethyldisiloxane and 1,1,3,3-tetraphenyldisiloxane; trisiloxanes such as phenyltris(dimethylsiloxy)silane and 1,3,5-trimethylcyclotrisiloxane; and polysiloxanes such as a trimethylsiloxy-terminated poly(methylhydrogensiloxane), a trimethylsiloxy-terminated poly(dimethylsiloxane/methylhydrogensiloxane), a dimethylhydrogensiloxy-terminated poly(methylhydrogensiloxane), and a resin consisting essentially of $H(CH_3)_2SiO_{1/2}$ units, $(CH_3)_3SiO_{1/2}$ units, and $SiO_{4/2}$ units.

Component (B) can be a single organohydrogensiloxane or a mixture comprising two or more organohydrogensiloxanes that differ in at least one property, such as structure, average molecular weight, viscosity, siloxane units, and sequence.

The concentration of component (B) in the silicone composition of the present invention is sufficient to cure (crosslink) the composition. The exact amount of component (B) depends on the desired extent of cure, which generally increases as the ratio of the number of moles of silicon-bonded hydrogen atoms in component (B) to the number of moles of alkenyl groups in component (A) increases. The concentration of component (B) can be can be sufficient to provide from 0.8 to 3 silicon-bonded hydrogen atoms or alternatively from 0.8 to 1.5 silicon-bonded hydrogen atoms, per alkenyl group in component (A).

Methods of preparing organohydrogensiloxanes, such as hydrolysis and condensation of organohalosilanes, are well known in the art.

Component (C) is at least one inorganic filler having a surface area (B.E.T. method) less than 25 $m^2/g$, alternatively from 0.25 to 10 $m^2/g$, alternatively from 0.25 to 5 $m^2/g$. Component (C) can be any inorganic filler having a surface area less than 25 $m^2/g$ typically employed in hydrosilylation addition-curable silicone compositions to modify the rheological properties of the composition, the cost of the composition, or to modify the mechanical, electrical, chemical, or thermal properties of the cured silicone product.

The inorganic filler comprises particles having an average size of from 0.2 to 150 μm or alternatively from 0.2 to 20 μm.

Although the shape of the inorganic filler particles is not critical, particles having a spherical shape are preferred because they generally impart a smaller increase in viscosity to the silicone composition than particles having other shapes.

The pH value of the inorganic filler at room temperature (15 to 25° C.) can be from 3 to 9 or alternatively from 6 to 9. The pH of a filler can be determined by measuring the pH value of a slurry of 10 g of the filler in 10 mL of distilled water, as exemplified in ASTM D 4972. When the pH of the filler is less than about 3, the cured silicone product typically exhibits reduced thermal stability. When the pH of the filler is greater than about 9, the silicone composition typically becomes unstable upon storage and/or the cured silicone product exhibits reduced thermal stability.

The filler can have a water (moisture) content not greater than 2% by weight or alternatively not greater than 1% by weight. The water content of a filler can be determined by measuring the weight loss on drying the filler at 110° C., as exemplified in ASTM D 2216. When the water content is greater than about 2% by weight, the organohydrogensiloxane and water can react in the presence of the hydrosilylation catalyst. This reaction consumes the organohydrogensiloxane required for curing the silicone composition and produces hydrogen gas, which may cause formation of voids in the cured silicone product.

Examples of inorganic fillers include, but are not limited to, natural silicas such as crystalline silica, ground crystalline silica, and diatomaceous silica; synthetic silicas such as fused silica, silica gel, and silicates such as mica, wollastonite, feldspar, and nepheline syenite; metal oxides such as aluminum oxide, titanium dioxide, magnesium oxide, ferric oxide, beryllium oxide, chromium oxide, titanium oxide, and zinc oxide; metal nitrides such as boron nitride, silicon nitride, and aluminum nitride, metal carbides such as boron carbide, titanium carbide, and silicon carbide; carbon black; alkaline earth metal carbonates such as calcium carbonate; alkaline earth metal sulfates such as calcium sulfate, magnesium sulfate, and barium sulfate; molybdenum disulfate; zinc sulfate; kaolin; talc; glass fiber; glass beads such as hollow glass microspheres and solid glass microspheres; aluminum trihydrate; asbestos; and metallic powders such as aluminum, copper, nickel, iron, and silver powders. A suggested inorganic filler is fused silica.

Component (C) can also be a treated inorganic filler, prepared by treating the surfaces of the aforementioned inorganic fillers with an organosilicon compound. The organosilicon compound can be any of the organosilicon compounds typically used to treat silica fillers. Examples of organosilicon compounds include, but are not limited to, organochlorosilanes such as methyltrichlorosilane, dimethyldichlorosilane, and trimethyl monochlorosilane; organosiloxanes such as hydroxy-endblocked dimethylsiloxane oligomer, hexamethyldisiloxane, and tetramethyldivinyldisiloxane; organosilazanes such as hexamethyldisilazane, hexamethylcyclotrisilazane; and organoalkoxysilanes such as methyltrimethoxysilane, vinyltrimethoxysilane, vinyltriethoxysilane, 3-glycidoxypropyltrimethoxysilane, and 3-methacryloxypropyltrimethoxysilane.

Component (C) can be a single inorganic filler as described above or a mixture of two or more such fillers that differ in at least one property, such as surface area, surface treatment, particle size, density, and particle shape.

Component (C) is present in an effective amount in the silicone composition. As used herein, the term "effective amount" means that the concentration of component (C) is such that the silicone composition cures to form a product having a coefficient of thermal expansion from 60 to 280 $\mu$m/m/° C. between −40 and 150° C., as determined using the methods in the Examples below. The exact concentration of component (C) depends on the desired thermal properties, surface area of the filler, density of the filler, shape of the filler particles, surface treatment of the filler, and nature of the other components in the silicone composition.

The concentration of component (C) can be from 30 to 1200 parts by weight, alternatively from 100 to 600 parts by weight, or alternatively 150 to 400 parts by weight, per 100 parts by weight of component (A). When the concentration of component (C) is less than about 30 parts by weight, the cured silicone product does not exhibit a significant reduction in coefficient of thermal expansion compared with the silicone product produced from the same composition absent the inorganic filler. When the concentration of component (C) is greater than about 1200 parts by weight, the silicone composition has a very high viscosity and cures to form a brittle product. The effective amount of component (D) can be readily determined by routine experimentation using the methods in the Examples below.

Component (D) is at least one hydrosilylation catalyst that promotes the addition reaction of component (A) with component (B). The hydrosilylation catalyst can be any of the well-known hydrosilylation catalysts comprising a platinum group metal, a compound containing a platinum group metal, or a microencapsulated platinum group metal-containing catalyst. Platinum group metals include platinum, rhodium, ruthenium, palladium, osmium and iridium. Preferably, the platinum group metal is platinum, based on its high activity in hydrosilylation reactions.

Examples of hydrosilylation catalysts include the complexes of chloroplatinic acid and certain vinyl-containing organosiloxanes disclosed by Willing in U.S. Pat. No. 3,419,593, which is hereby incorporated by reference. A specific example of such a catalyst is the reaction product of chloroplatinic acid and 1,3-diethenyl-1,1,3,3-tetramethyldisiloxane.

The hydrosilylation catalyst can also be a microencapsulated platinum group metal-containing catalyst comprising a platinum group metal encapsulated in a thermoplastic resin. Compositions containing microencapsulated hydrosilylation catalysts are stable for extended periods of time, typically several months or longer, under ambient conditions, yet cure relatively rapidly at temperatures above the melting or softening point of the thermoplastic resin(s). Microencapsulated hydrosilylation catalysts and methods of preparing them are well known in the art, as exemplified in U.S. Pat. No. 4,766,176 and the references cited therein; and U.S. Pat. No. 5,017,654.

Component (D) can be a single hydrosilylation catalyst or a mixture comprising two or more different catalysts that differ in at least one property, such as structure, form, platinum group metal, complexing ligand, and thermoplastic resin.

The concentration of component (D) is sufficient to catalyze the addition reaction of component (A) with component (B). The concentration of component (D) can be sufficient to provide from 0.1 to 1000 ppm of a platinum group metal, alternatively from 1 to 500 ppm of a platinum group metal, or alternatively from 5 to 150 ppm of a platinum group metal, based on the combined weight of components (A), (B), and (C). The rate of cure is very slow below 0.1 ppm of platinum group metal. The use of more than 1000 ppm of platinum group metal results in no appreciable increase in cure rate, and is therefore uneconomical.

The silicone composition can comprise additional ingredients, provided the ingredient does not prevent the composition from curing to form a silicone resin having low CTE and low modulus, as described above. Examples of additional ingredients include, but are not limited to, hydrosilylation catalyst inhibitors; organopolysiloxane resins, adhesion promoters, such as the adhesion promoters taught in U.S. Pat. Nos. 4,087,585 and 5,194,649; dyes; pigments; anti-oxidants; heat stabilizers; UV stabilizers; flame retardants; flow control additives; and organic solvents.

Examples of hydrosilylation catalyst inhibitors include various "ene-yne" systems such as 3-methyl-3-penten-1-yne and 3,5-dimethyl-3-hexen-1-yne; acetylenic alcohols such as 3,5-dimethyl-1-hexyn-3-ol, 1-ethynyl-1-cyclohexanol, and 2-phenyl-3-butyn-2-ol; maleates and fumarates, such as the well known dialkyl, dialkenyl, and dialkoxyalkyl fumarates and maleates; and cyclovinylsiloxanes.

Examples of organic solvents include saturated hydrocarbons such as pentane, hexane, and heptane; aromatic hydrocarbons such as benzene, toluene and xylene; mineral spirits; halohydrocarbons such as dichloromethane, chloroform, and 1,1,1-trichloroethane; esters such as ethyl acetate; ketones, such as acetone, methyl ethyl ketone, and methyl isobutyl ketone; and mixtures of such solvents.

One type of organopolysiloxane resin consists essentially of $R^3{}_3SiO_{1/2}$ siloxane units and $SiO_{4/2}$ siloxane units wherein each $R^3$ is independently selected from monovalent hydrocarbon and monovalent halogenated hydrocarbon groups having from 1 to 20 carbon atoms and the mole ratio of $R^3{}_3SiO_{1/2}$ units to $SiO_{4/2}$ units in the organopolysiloxane resin is from 0.65 to 1.9.

When the silicone composition further comprises an organopolysiloxane resin, the concentration of the crosslinking agent can be sufficient to provide from 0.8 to 3 silicon-bonded hydrogen atoms per alkenyl group in component (A) and the organopolysiloxane resin combined.

The concentration of the organopolysiloxane resin in the silicone composition of the present invention can be from 1 to 100 parts by weight or alternatively from 30 to 100 parts by weight, per 100 parts by weight of component (A).

The organopolysiloxane resin of the present invention can be prepared by well known methods in the art as exemplified in U.S. Pat. No. 2,676,182 to Daudt et al.

In a preferred embodiment, the silicone composition further comprises a silica filler having a surface area (B.E.T.

method) of from 50 to 400 m²/g. The silica filler imparts thixotropy to the silicone composition. As used herein, the term thixotropy means that the composition exhibits a reduction in viscosity when a shearing force is applied and an increase in viscosity upon subsequent rest. The degree of thixotropy can be determined by measuring the thixotropy index of the composition. For example, the thixotropy index can be expressed as the ratio of the viscosity of the silicone composition at a shear rate of 1 rad/s to the viscosity of the composition at a shear rate of 10 rad/s, wherein each viscosity is measured at 23±2° C.

Examples of suitable silica fillers include, but are not limited to, fumed silica, precipitated silica, and treated silica fillers prepared by treating surfaces of the aforementioned silica with an organosilicon compound. Suitable organosilicon compounds are exemplified above for component (C).

The concentration of the silica filler can be from 0.5 to 20 parts by weight or alternatively from 0.5 to 10 parts by weight, per 100 parts by weight of component (A).

The silicone composition of the present invention can be a one-part composition comprising components (A) through (D) in a single part or, alternatively, a multi-part composition comprising components (A) through (D) in two or more parts. In a multi-part composition, components (A), (B), and (D) are typically not present in the same part unless an inhibitor is also present. For example, a multi-part silicone composition can comprise a first part containing a portion of component (A), a portion of component (C), and all of component (D), and a second part containing the remaining portions of component (A) and (C) and all of component (B).

The one-part silicone composition of the instant invention can be prepared by combining components (A) through (D) and any optional ingredients in the stated proportions at ambient temperature with or without the aid of a solvent, which is described above. Although the order of addition of the various components is not critical when the silicone composition is to be used immediately, the hydrosilylation catalyst is preferably added last at a temperature below about 30° C. to prevent premature curing of the composition. Also, the multi-part silicone composition of the present invention can be prepared by combining the particular components designated for each part.

The semiconductor package of the present invention is exemplified, but not limited, to the embodiments described below and shown in FIGS. 1–4. In the Figures, only a portion of a wafer having a single bond pad is shown.

Figure 1:
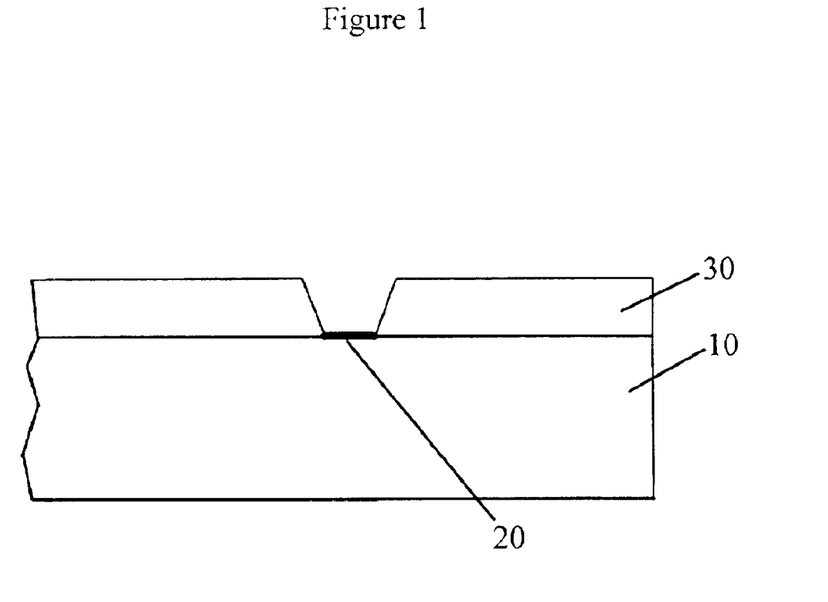
FIG. 1 shows a cross-sectional view of a first embodiment of a semiconductor package according to the present invention, wherein the silicone member is a layer.

In a first embodiment of a semiconductor package according to the present invention, shown in FIG. 1, the semiconductor package comprises a semiconductor wafer 10 having an active surface comprising at least one integrated circuit (not shown), wherein each integrated circuit has a plurality of bond pads 20; and a cured silicone layer 30 covering the active surface of the wafer except the bond pads 20.

Figure 2:
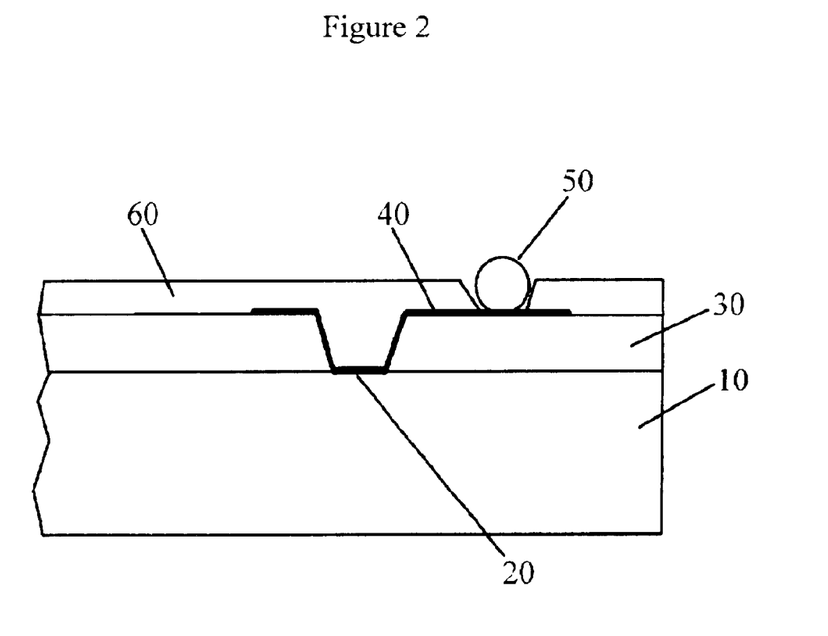
FIG. 2 shows a cross-sectional view of a second embodiment of a semiconductor package according to the present invention, wherein the silicone member is a layer.

In a second embodiment of a semiconductor package according to the present invention, shown in FIG. 2, the semiconductor package comprises a semiconductor wafer 10 having an active surface comprising at least one integrated circuit (not shown), wherein each integrated circuit has a plurality of bond pads 20; a cured silicone layer 30 covering the active surface of the wafer except the bond pads 20, a metal trace 40 having a proximal end attached to each bond pad 20 and a distal end lying on the surface of the silicone layer 30; a solder bump 50 attached to the distal end of each trace 40; and a solder mask 60 covering the bond pads 20, silicone layer 30, and metal trace 40.

Figure 3:
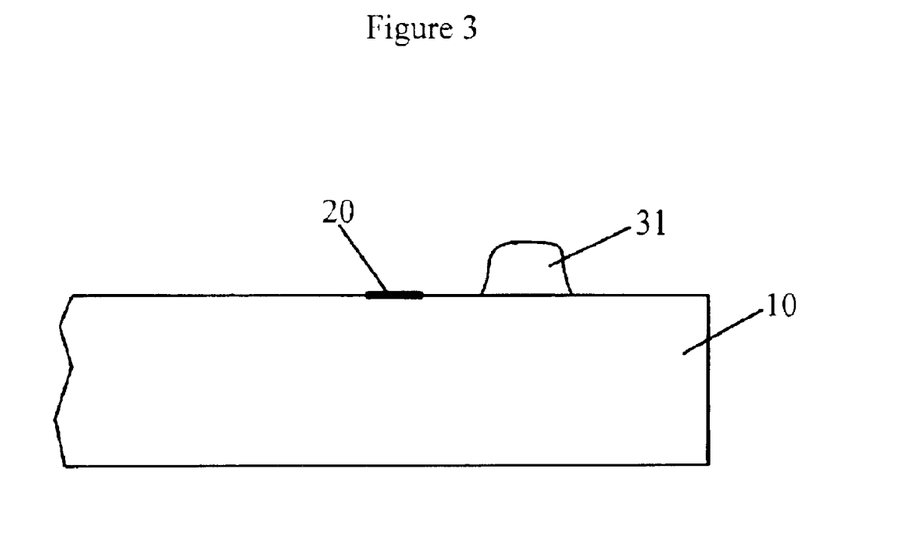
FIG. 3 shows a cross-sectional view of a third embodiment of a semiconductor package according to the present invention, wherein the silicone member is a dome.

In a third embodiment of a semiconductor package, shown in FIG. 3, the semiconductor package comprises a semiconductor wafer 10 having an active surface comprising at least one integrated circuit (not shown), wherein each integrated circuit has a plurality of bond pads 20; and a cured silicone dome 31 covering a portion of the active surface of the wafer except the bond pads 20.

Figure 4:
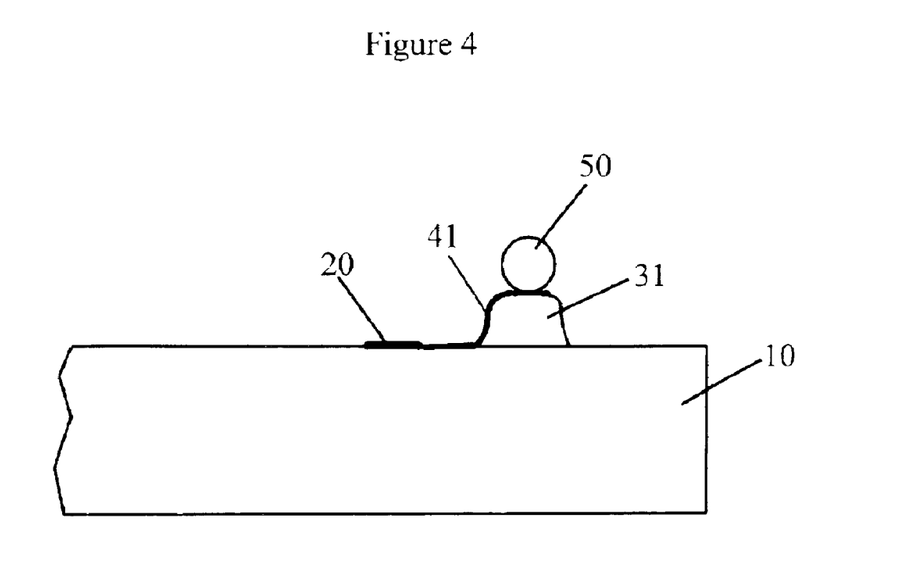
FIG. 4 shows a cross-sectional view of a fourth embodiment of a semiconductor package according to the present invention, wherein the silicone member is a dome.

In a fourth embodiment of a semiconductor package, shown in FIG. 4, the semiconductor package comprises a semiconductor wafer 10 having an active surface comprising at least one integrated circuit (not shown), wherein each integrated circuit has a plurality of bond pads 20; a cured silicone dome 31 covering a portion of the active surface of the wafer except the bond pads 20; a metal trace 41 having a proximal end attached to each bond pad 20 and a distal end lying on the surface of the cured silicone dome 31; and a solder bump 50 attached to the distal end of each trace 41.

In the above embodiments, the metal traces reroute or redistribute the peripheral bond pads on the ICs to an area array configuration. The traces comprise an electrically conductive metal or alloy. Examples of metals include chromium, titanium, copper, gold, and nickel. In particular, the metal trace can consist of a three-layer system of titanium/nickel/copper, where titanium is the adhesion layer, nickel is a diffusion barrier, and copper is the main trace metal. Also, the solder mask can be a cured product of the silicone composition of the present invention. The preceding wafer-level package design absent the silicone composition of the present invention is known in the art. For example, Kang et al. report a wafer-level chip-scale package containing a modified polyimide as a stress buffer layer, a solder mask consisting of benzocyclobutene, and a redistribution network consisting of metal runners and solder balls (Electronic Components and Technology Conference Proceedings, 2000, 87–92).

A method of preparing a semiconductor package according to the present invention comprises the steps of:

(i) printing a silicone composition on at least a portion of an active surface of a semiconductor wafer to form at least one silicone deposit, wherein the active surface comprises at least one integrated circuit, each integrated circuit has a plurality of bond pads, at least a portion of each bond pad is not covered by the silicone deposit, and the silicone composition comprises:

(A) an organopolysiloxane containing an average of at least two silicon-bonded alkenyl groups per molecule, (B) an organosilicon compound containing an average of at least two silicon-bonded hydrogen atoms per molecule in a concentration sufficient to cure the composition, (C) an effective amount of an inorganic filler having a surface area less than 25 m²/g, and (D) a catalytic amount of a hydrosilylation catalyst; and (ii) heating the silicone deposit for an amount of time sufficient to form a cured silicone member, wherein the member has a coefficient of linear thermal expansion of from 60 to 280 μm/m° C. between −40 and 150° C. and a modulus of from 1 to 300 MPa at 25° C.

The silicone composition can be applied to the active surface of the semiconductor wafer using conventional stencil printing or screen printing methods, depending on the desired thickness of the deposit. In general, screen printing can be used to produce deposits having a thickness up to 150 μm and stencil printing can be used to produce deposits having a thickness up to 300 μm. The particular print conditions depend on the rheological properties of the uncured silicone composition, aperture dimensions, and method of printing (i.e., stencil or screen). For example, the silicone composition can be applied by stencil or screen printing using a squeegee pressure from 2 to 25 lbf, a speed of 0.2 to 5 in./s (0.5 to 12.7 cm/s), and a snap-off adjustment from 0 to 0.1 in. (0 to 2.5 mm).

The silicone deposit is then heated for an amount of time sufficient to form the cured silicone member. The silicone deposit can be heated for an amount of time sufficient to achieve a desired crosslink density without oxidation or decomposition. For example, the deposit can be heated at a temperature of from 70 to 250° C. for 3 to 360 min., alternatively from 90 to 200° C. for 5 to 60 min., or alternatively from 100 to 150° C. for 15 to 60 min. The silicone deposit can be heated using conventional equipment such as a hot plate or oven.

The present method can further comprise attaching a spring contact to each bond pad and separating the package into individual IC chips. Examples of spring contacts and methods of attaching spring contacts to semiconductor devices are known in the art, as exemplified in U.S. Pat. No. 6,168,974B1 to Chang et al.

Conversely, the method can further comprise separating the package into individual IC chips and assembling each chip into a leadframe package. The assembly process typically includes attaching each chip to a leadframe, connecting (usually wire bonding) the bond pads on each chip to the leads on the leadframe, and sealing the parts of the housing together or encapsulating the assembly with a molding compound. Methods of assembling leadframe packages, such as DIP, SH-DIP, SK-DIP, SL-DIP, SIP, ZIP, PGA, SO, SOP, LCC, PLCC, and SOJ, are well known in the art.

On the other hand, the method can further comprise separating the package into individual IC chips and assembling each chip into a Ball Grid Array (BGA) package. Methods of assembling BGA packages are also well known in the art.

The semiconductor package shown in FIG. 1 can be prepared by (i) printing a silicone composition on an active surface of a semiconductor wafer 10 to form a silicone layer, wherein the active surface comprises at least one integrated circuit, each integrated circuit has a plurality of bond pads 20, the bond pads 20 are not covered by the silicone layer, and the silicone composition comprises components (A)–(D), described above; and (ii) heating the silicone layer for an amount of time sufficient to form a cured silicone layer 30, wherein the cured silicone layer has a coefficient of linear thermal expansion of from 60 to 280 $\mu$m/m° C. between −40 and 150° C. and a modulus of from 1 to 300 MPa at 25° C.

The semiconductor package shown in FIG. 2 can be prepared by (i) printing a silicone composition on an active surface of a semiconductor wafer 10 to form a silicone layer, wherein the active surface comprises at least one integrated circuit, each integrated circuit has a plurality of bond pads 20, the bond pads 20 are not covered by the silicone layer, and the silicone composition comprises components (A)–(D), described above; and (ii) heating the silicone layer for an amount of time sufficient to form a cured silicone layer 30, wherein the cured silicone layer has a coefficient of linear thermal expansion of from 60 to 280 $\mu$m/m° C. between −40 and 150° C. and a modulus of from 1 to 300 MPa at 25° C.; (iii) forming a metal trace 40 having a proximal end attached to each bond pad 20 and a distal end lying on the surface of the silicone layer 30; (iv) applying a solder mask 60 covering the bond pads 20, silicone layer 30, and metal traces 40, wherein a potion of the distal end of each trace 40 is free of the solder mask 60; and (v) forming a solder bump 50 on the distal end of each trace 40. The resulting semiconductor package can be separated into individual IC chips using, for example, a conventional wafer saw.

The semiconductor package shown in FIG. 3 can be prepared by (i) printing a silicone composition on an active surface of a semiconductor wafer 10 to form at least one silicone dome, wherein the active surface comprises at least one integrated circuit, each integrated circuit has a plurality of bond pads 20, the bond pads 20 are not covered by the silicone dome, and the silicone composition comprises components (A)–(D), described above; and (ii) heating the silicone dome for an amount of time sufficient to form a cured silicone dome 31, wherein the cured silicone dome has a coefficient of linear thermal expansion of from 60 to 280 $\mu$m/m° C. between −40 and 150° C. and a modulus of from 1 to 300 MPa at 25° C.

The semiconductor package shown in FIG. 4 can be prepared by (i) printing a silicone composition on an active surface of a semiconductor wafer 10 to form a silicone dome, wherein the active surface comprises at least one integrated circuit, each integrated circuit has a plurality of bond pads 20, the bond pads are not covered by the silicone dome, and the silicone composition comprises components (A)–(D), described above; (ii) heating the heating the silicone dome for an amount of time sufficient to form a cured silicone dome 31, wherein the member has a coefficient of linear thermal expansion of from 60 to 280 $\mu$m/m° C. between −40 and 150° C. and a modulus of from 1 to 300 MPa at 25° C.; (iii) forming a metal trace 41 having a proximal end attached to each bond pad 20 and a distal end lying on the surface of the cured silicone dome 31; and (iv) forming a solder bump 50 on the distal end of each trace 41. The resulting semiconductor package can be separated into individual IC chips using, for example, a conventional wafer saw.

In the above embodiments of the present method, the metal traces can be formed using conventional sputtering, lithography, and electroplating techniques as reported, for example, by Kang et al. (Electronic Components and Technology Conference, 2000, 87–92).

The semiconductor package of the present invention exhibits good thermal stability over a wide range of temperatures and good environmental resistance. Also, the semiconductor package permits simultaneous testing of all ICs on a wafer. Moreover, individual chips can be singulated (separated) from the wafer-level semiconductor package, with each chip having a size only slightly larger than the IC itself. These "chip scale packages", which are lighter, smaller, and thinner than conventional IC packages, are ideally suited for high-density applications.

The method of preparing the semiconductor package of the present invention is scaleable to a high throughput manufacturing process. Importantly, the method provides simultaneous packaging of all ICs on a wafer. Additionally, the method employs conventional stencil printing equipment and methods. Compared with classical spin-coating methods, the present method features less waste of material (silicone composition), and fewer process steps.

The semiconductor package of the present invention can be used to prepare individual IC chip packages. The chip packages are useful for fabricating printed wiring boards, which can be incorporated into electronic equipment, such as calculators, telephones, televisions, and mainframe and personal computers.

These and other features, aspects, and advantages of the present invention will become better understood with reference to the following description, appended claims, and accompanying drawings.

EXAMPLES

The following examples are presented to further illustrate the silicone composition of this invention, but are not to be considered as limiting the invention, which is delineated in the appended claims. Unless otherwise noted, all parts and percentages reported in the examples are by weight.

Measurement of Viscosity

The viscosity of a silicone composition was determined using a Rheometric Scientific SR-5000 parallel plate rheometer equipped with 25-mm plates. The rheometer was operated in a stress-controlled mode at 25° C. The shear rate was increased from 100 to 5000 dynes/cm$^2$ during a 5 min. period. The reported values for viscosity, expressed in dynes/cm$^2$, were determined at shear rates of 1.0 sec$^{-1}$ and 10 sec$^{-1}$.

Preparation of Silicone Samples

Figure 5:
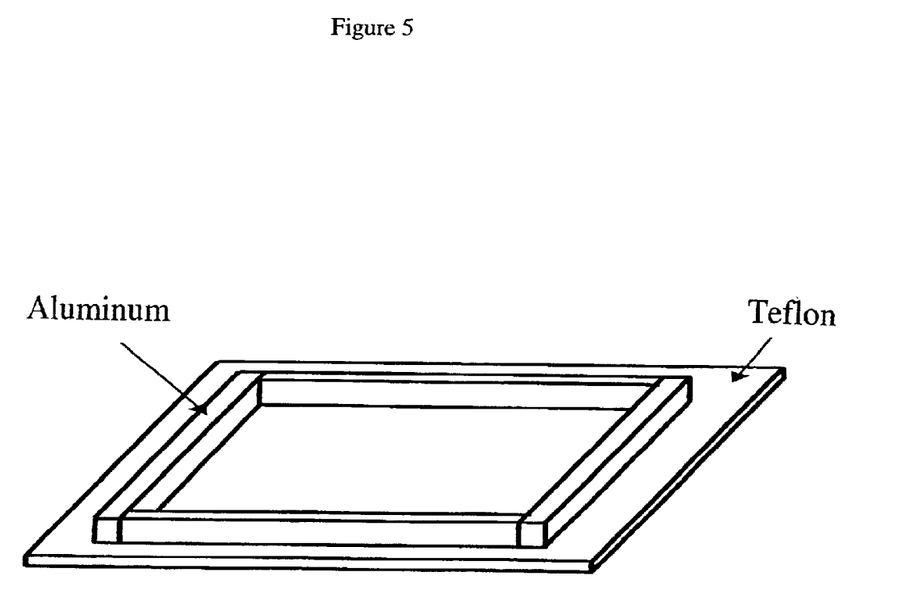
FIG. 5 shows a mold for preparing a cured silicone sample.

A silicone composition was poured into a rectangular mold having internal dimensions of 3.0 in.×6.0 in.×0.075 in. (7.6 cm×15 cm×0.19 cm) and constructed of aluminum and a Teflon sheet (FIG. 5). The filled mold was covered with a Teflon sheet and heated in a press at 150° C. for 15 min. under a mass of 10 ton (9072 kg). The mold was allowed to cool to room temperature and the silicone sample was removed. The sample was heated on a Teflon sheet in an oven at 150° C. for 45 min. and then maintained at room temperature for at least 24 h.

Preparation of Silicone Test Specimens

Test specimens for measurement of durometer hardness, tensile strength, elongation, and chord modulus were prepared by cutting three dumbbell-shaped specimens from each silicone sample using Die C in accordance with the procedure described in ASTM D 412.

Test specimens for measurement of coefficient of linear thermal expansion were prepared by cutting cylindrical specimens having a diameter of 0.25 in. (0.64 cm) and length of 0.075 in. (0.19 cm) from silicone samples.

Measurement of Durometer Hardness

The durometer hardness of a silicone test specimen was determined using a Shore Type A instrument according to ASTM D 2240. Three test specimens from the same silicone sample were stacked to achieve a total thickness of 0.22 in. (0.57 cm). Hardness measurements were performed on the outer surface of the uppermost test specimen. Reported values for durometer hardness represent the average of three measurements performed at different locations on the same test specimen.

Measurement of Tensile Strength, Elongation, and Chord Modulus

Tensile strength at ultimate elongation, ultimate elongation, and chord modulus of a silicone test specimen were determined using a Monsanto Tensiometer 2000 according to ASTM D 412. The rate of grip separation was 20 in./min (0.85 cm/s). Chord modulus was calculated from the stress-strain curve using the method described in ASTM E 111-97. Reported values for tensile strength (Pa), elongation (%), and chord modulus (MPa) each represent the average of three measurements made on different dumbbell-shaped test specimens from the same silicone sample.

Measurement of Coefficient of Linear Thermal Expansion

Coefficient of linear thermal expansion of a silicone test specimen was determined using a TA Instruments TMA 2910 thermomechanical analyzer. A flat quartz probe having a diameter of 0.125 in. (0.318 cm) was brought into contact with the surface of the specimen. A force of 0.1 Newton was applied to the probe and the temperature of the specimen was increased from 30° C. to 200° C. at a rate of 5° C./min. The displacement of the probe as a function of temperature was recorded, and the slope of the best fit line between 50 and 150° C. was used to determine CTE. The coefficient of linear thermal expansion, expressed in units of $\mu$m/m/° C., was obtained by dividing the linear expansion per unit length by the change in temperature.

Method of Printing

Silicone compositions were printed directly on the flat surface of a 150-mm silicon wafer using a Speedline Technologies model MPM/SPM stencil printer equipped with a squeegee having a length of 8.0 in. (20 cm) and a stainless steel stencil having a thickness of 0.0015 in. (0.038 mm) and containing multiple 0.013-in. (0.33 mm) circular apertures. The stencil printer was operated at a squeegee pressure of 13 lbf (58 N), a snap-off adjustment of 0.01 in. (0.2 mm), and a speed of 0.4 in./s (1 cm/s). The wafer was heated in an oven at a temperature of 150° C. for 15 min.

Measurement of Print Dimensions

The dimensions of printed features were determined using a Tencor P-11 profilometer. The reported values for base width, top width, average height, and peak each represent the average of three measurements performed on different features of the same wafer.

Reagents

The following chemical substances were used in the Examples:

Polymer A: a dimethylhexenylsiloxy-terminated poly(dimethylsiloxane/methylhexenylsiloxane) having an average of 146 dimethylsiloxane units and two methylhexenylsiloxane units per molecule, and a viscosity of 0.42 Pa·s at 25° C.

Polymer B: a mixture consisting of 66.9% of a dimethylvinylsiloxy-terminated poly(dimethylsiloxane) having a viscosity of about 2 Pa·s at 25° C., 2.1% of a dimethylvinylsiloxy-terminated poly(dimethylsiloxane) having a viscosity of about 55 Pa·s at 25° C., and 31% of an organopolysiloxane resin consisting essentially of $CH_2$=$CH(CH_3)_2SiO_{1/2}$ units, $(CH_3)_3SiO_{1/2}$ units, and $SiO_{4/2}$ units, wherein the mole ratio of $CH_2$=$CH(CH_3)_2SiO_{1/2}$ units and $(CH_3)_3SiO_{1/2}$ units combined to $SiO_{4/2}$ units is about 0.7, and the resin has a weight-average molecular weight of about 22,000, a polydispersity of about 5, a viscosity of 5 Pa·s at 25° C., and the resin contains about 1.8% by weight (about 5.5 mole %) of vinyl groups.

Polymer C: a mixture consisting of 85% of a dimethylvinylsiloxy-terminated poly(dimethylsiloxane) having a viscosity of about 3 mPa·s at 25° C., 10% of dimethylcylcosiloxanes, and 5% of tetramethyldivinyldisiloxane.

Polymer D: a dimethylvinylsiloxy-terminated poly(dimethylsiloxane) having an average degree of polymerization of about 830 and a viscosity of 55 Pa·s at 25° C.

Crosslinking Agent A: an organohydrogenpolysiloxane consisting essentially of $H(CH_3)_2SiO_{1/2}$ units, $(CH_3)_3SiO_{1/2}$ units, and $SiO_{4/2}$ units, wherein the organohydrogenpolysiloxane contains about 1.0 percent by weight of silicon-bonded hydrogen atoms and has a viscosity of about 2.4×10$^{-5}$ m$^2$/s at 25° C.

Crosslinking Agent B: a trimethylsiloxy-terminated poly(dimethylsiloxane/methylhydrogensiloxane) having an average of 3 dimethylsiloxane units and 5 methylhydrogensiloxane units per molecule, a viscosity of 5 mPa·s at 25° C., and containing about 0.8% of silicon-bonded hydrogen atoms.

Crosslinking Agent C: a mixture consisting of 90% of a trimethylsiloxy-terminated poly(dimethylsiloxane/ methylhydrogensiloxane) having an average of 16 dimethylsiloxane units and 39 methylhydrogensiloxane units per molecule and containing about 1.05% of silicon-bonded hydrogen atoms; and 10% of low boiling cyclic and linear dimethylmethylhydrogensiloxanes.

Filler A: an electronic DRAM grade spherical fused silica having an average particle size of 4.4 micron and an average surface area of about 1.3 m$^2$/g.

Filler B: a treated fumed silica sold under the trademark CAB-O-SIL TS-530 by Cabot Corporation. The treated fumed silica is a high-purity silica which has been treated with hexamethyldisilazane. The treated fumed silica has a surface area (BET) of 212±28 m$^2$/g, a carbon content of 4.25±0.5 percent by weight, and a specific gravity of 2.2 g/cm$^3$.

Adhesion Promoter: a reaction product of a hydroxy-terminated (dimethylsiloxane/methylvinylsiloxane) having an average of two dimethylsiloxane units and two methylvinylsiloxane units per molecule and glycidoxypropyltrimethoxysilane. The product was prepared by reacting equal parts by weight of the siloxane and glycidoxypropyltrimethoxysilane at a temperature of 140° C. for 2 hours in the presence of a potassium catalyst. The reaction mixture was neutralized with bis(dimethylvinylsilyl)vinylphosphonate and devolatilized for two hours at a temperature of 130° C. and a pressure of 6.7 kPa.

Catalyst: a mixture consisting of 40 percent by weight of a complex of platinum with 1,3-divinyl-1,1,3,3-tetramethyldisiloxane dispersed in a thermoplastic silicone resin, wherein the resin consists of 78 mole percent monophenylsiloxane units and 22 mole percent dimethylsiloxane units and the resin has a softening point of 60–90° C.; 55 percent by weight of Polymer B, a dimethylvinylsiloxy-terminated poly(dimethylsiloxane) having a viscosity of 2 Pa·s at 25° C. and a vinyl content of 0.2 percent by weight; and 5 percent by weight of a hexamethyldisilazane-treated fumed silica. The catalyst has a platinum content of about 0.16 percent by weight (1600 ppm).

Inhibitor: 2-Phenyl-3-butyn-2-ol.

Example 1

Polymer B (20.9 parts), 79.1 parts of Polymer D, 1.2 parts of Crosslinking Agent C, and 194.5 parts of Filler A were blended in a changed can mixer until the filler became uniformly distributed in the mixture. Inhibitor (0.04 part) and 3.7 parts of Catalyst were added to the mixture and mixing was continued for about 20 min. The silicone composition had a viscosity of 235.6 Pa·s at 1.0 rad/s and 193.4 Pa·s at 10 rad/s. The physical properties of the cured silicone product are shown in Table 1.

Example 2

Polymer A (75.0 parts), 25.0 parts of Polymer B, 2.5 parts of Crosslinking Agent A, 3.2 parts of Crosslinking Agent B, 291.6 parts of Filler A, and 4.2 parts of Filler B were blended in a changed can mixer until the filler became uniformly distributed in the mixture. Inhibitor (0.05 part) and 2.5 parts of Catalyst were added to the mixture and mixing was continued for about 20 min. The silicone composition had a viscosity of 177.0 Pa·s at 1.0 rad/s and 27.9 Pa·s at 10 rad/s. The physical properties of the cured silicone product are shown in Table 1.

Example 3

Polymer B (50.0 parts), 50.0 parts of Polymer C, 18.3 parts of Crosslinking Agent C, 345.3 parts of Filler A, and 9.8 parts of Filler B were blended in a changed can mixer until the filler became uniformly distributed in the mixture. Inhibitor (0.06 part) and 3.1 parts of Catalyst were added to the mixture and mixing was continued for about 20 min. The silicone composition had a viscosity of 322.8 Pa·s at 1.0 rad/s and 42.6 Pa·s at 10 rad/s. The physical properties of the cured silicone product are shown in Table 1.

TABLE 1

| Example | Durometer Hardness (Shore A) | Tensile Strength (MPa) | Elongation (%) | Chord Modulus (MPa) | CTE (µm/m/° C.) |
| --- | --- | --- | --- | --- | --- |
| 1 | 67.6 | 3.51 | 99.90 | 3.5 | 157 |
| 2 | 93.0 | 6.40 | 11.91 | 53.8 | 110 |
| 3 | 92.0 | 6.28 | 4.23 | 148.5 | 70 |

What is claimed is:

1. A semiconductor package comprising:
   a semiconductor wafer having an active surface comprising at least one integrated circuit, wherein each integrated circuit has a plurality of bond pads; and
   at least one cured silicone member covering at least a portion of the active surface, wherein at least a portion of each bond pad is not covered by the silicone member, the silicone member has a coefficient of linear thermal expansion of from 60 to 280 µm/m° C. between −40 and 150° C. and a modulus of from 1 to 300 MPa at 25° C., and the silicone member is prepared by a method comprising the steps of:
   (i) printing a silicone composition on the active surface to form a silicone deposit, wherein the silicone composition comprises:
      (A) an organopolysiloxane containing an average of at least two silicon-bonded alkenyl groups per molecule with any remaining silicon-bonded organic groups being independently selected from monovalent hydrocarbon groups free of aliphatic unsaturation or monovalent halogenated hydrocarbon groups free of aliphatic unsaturation,
      (B) an organohydrogensiloxane containing an average of at least two silicon-bonded hydrogen atoms per molecule in a concentration sufficient to cure the composition,
      (C) an effective amount of an inorganic filler having a surface area less than 25 m$^2$/g, and
      (D) a catalytic amount of a hydrosilylation catalyst; and
   (ii) heating the silicone deposit for an amount of time sufficient to form the cured silicone member.

2. The semiconductor package according to claim 1, wherein the wafer further comprises streets.

3. The semiconductor package according to claim 1, wherein the cured silicone member has a thickness of from 10 to 200 µm.

4. The semiconductor package according to claim 1, wherein the concentration of component (B) is sufficient to provide from 0.8 to 1.5 silicon-bonded hydrogen atoms per alkenyl group in component (A).

5. The semiconductor package according to claim 1, wherein the inorganic filler has surface area of from 0.25 to 10 m$^2$/g.

6. The semiconductor package according to claim 1, wherein the inorganic filler is fused silica.

7. The semiconductor package according to claim 1, wherein the concentration of component (C) is from 100 to 600 parts by weight per 100 parts by weight of component (A).

8. The semiconductor package according to claim 1, wherein the hydrosilylation catalyst comprises platinum.

9. The semiconductor package according to claim 1, wherein the silicone composition further comprises a hydrosilylation catalyst inhibitor.

10. The semiconductor package according to claim 1, further comprising an organopolysiloxane resin consisting essentially of $R^3{}_3SiO_{1/2}$ siloxane units and $SiO_{4/2}$ siloxane units wherein each $R^3$ is independently selected from monovalent hydrocarbon and monovalent halogenated hydrocarbon groups having from 1 to 20 carbon atoms and the mole ratio of $R^3{}_3SiO_{1/2}$ units to $SiO_{4/2}$ units in the organopolysiloxane resin is from 0.65 to 1.9.

11. The semiconductor package according to claim 1, wherein the cured silicone member is a cured silicone layer.

12. The semiconductor package according to claim 1, wherein the cured silicone member is a cured silicone dome.

13. The semiconductor package according to claim 1, further comprising a metal trace having a proximal end attached to each bond pad and a distal end lying on the surface of the cured silicone member.

14. A method of preparing a semiconductor package, the method comprising the steps of:
   (i) printing a silicone composition on at least a portion of an active surface of a semiconductor wafer to form at least one silicone deposit, wherein the active surface comprises at least one integrated circuit, each integrated circuit has a plurality of bond pads, at least a portion of each bond pad is not covered by the silicone deposit, and the silicone composition comprises:
      (A) an organopolysiloxane containing an average of at least two silicon-bonded alkenyl groups per molecule with any remaining silicon-bonded organic groups being independently selected from monovalent hydrocarbon groups free of aliphatic unsaturation or monovalent halogenated hydrocarbon groups free of aliphatic unsaturation,
      (B) an organosilicon compound containing an average of at least two silicon-bonded hydrogen atoms per molecule in a concentration sufficient to cure the composition,
      (C) an effective amount of an inorganic filler having a surface area less than 25 m²/g, and
      (D) a catalytic amount of a hydrosilylation catalyst; and
   (ii) heating the silicone deposit for an amount of time sufficient to form a cured silicone member, wherein the member has a coefficient of linear thermal expansion of from 60 to 280 μm/m° C. between −40 and 150° C. and a modulus of from 1 to 300 MPa at 25° C.

15. The semiconductor package according to claim 14, wherein the wafer further comprises streets.

16. The method according to claim 14, wherein the cured silicone member has a thickness of from 10 to 200 μm.

17. The method according to claim 14, wherein the concentration of component (B) is sufficient to provide from 0.8 to 1.5 silicon-bonded hydrogen atoms per alkenyl group in component (A).

18. The method according to claim 14, wherein the inorganic filler has surface area of from 0.25 to 10 m²/g.

19. The method according to claim 14, wherein the inorganic filler is fused silica.

20. The method according to claim 14, wherein the silicone composition further comprises an organopolysiloxane resin consisting essentially of $R^3{}_3SiO_{1/2}$ siloxane units and $SiO_{4/2}$ siloxane units wherein each $R^3$ is independently selected from monovalent hydrocarbon and monovalent halogenated hydrocarbon groups having from 1 to 20 carbon atoms and the mole ratio of $R^3{}_3SiO_{1/2}$ units to $SiO_{4/2}$ units in the organopolysiloxane resin is from 0.65 to 1.9.

21. The method according to claim 14, wherein the cured silicone member is a cured silicone layer.

22. The method according to claim 14, wherein the cured silicone member is a cured silicone dome.

23. The method according to claim 14, wherein the step of printing is carried out using stencil printing.

24. The method according to claim 14, wherein the step of printing is carried out using screen printing.

25. The method according to claim 14, wherein the step of heating the silicone deposit is carried out at a temperature of from 90 to 200° C. for 5 to 60 min.

26. The method according to claim 14, further comprising the step of forming a metal trace having a proximal end attached to each bond pad and a distal end lying on the surface of the cured silicone member.

27. The method according to claim 14, wherein the concentration of component (C) is from 100 to 600 parts by weight per 100 parts by weight of component (A).

28. The method according to claim 14, wherein the hydrosilylation catalyst comprises platinum.

29. The method according to claim 14, wherein the silicone composition further comprises a hydrosilylation catalyst inhibitor.

* * * * *